(12) United States Patent
Kvatinsky et al.

(10) Patent No.: US 12,341,510 B2
(45) Date of Patent: Jun. 24, 2025

(54) LOGIC GATES AND STATEFUL LOGIC USING PHASE CHANGE MEMORY

(71) Applicant: Technion Research & Development Foundation Limited, Haifa (IL)

(72) Inventors: Shahar Kvatinsky, Haifa (IL); Barak Hoffer, Haifa (IL); Eilam Yalon, Haifa (IL); Nicolas Wainstein, Haifa (IL)

(73) Assignee: Technion Research & Development Foundation Limited, Haifa (IL)

( * ) Notice: Subject to any disclaimer, the term of this patent is extended or adjusted under 35 U.S.C. 154(b) by 246 days.

(21) Appl. No.: 17/916,816

(22) PCT Filed: Apr. 7, 2021

(86) PCT No.: PCT/IL2021/050403
§ 371 (c)(1),
(2) Date: Oct. 4, 2022

(87) PCT Pub. No.: WO2021/205456
PCT Pub. Date: Oct. 14, 2021

(65) Prior Publication Data
US 2023/0155590 A1    May 18, 2023

Related U.S. Application Data

(60) Provisional application No. 63/006,114, filed on Apr. 7, 2020.

(51) Int. Cl.
*H03K 19/02*    (2006.01)
*G11C 13/00*    (2006.01)

(52) U.S. Cl.
CPC .......... *H03K 19/02* (2013.01); *G11C 13/0004* (2013.01); *G11C 13/0069* (2013.01); *G11C 13/0097* (2013.01); *G11C 2013/0092* (2013.01)

(58) Field of Classification Search
CPC ............ G11C 13/0004; G11C 13/0069; G11C 13/0097; G11C 2013/0092; H03K 19/02
See application file for complete search history.

(56) References Cited

U.S. PATENT DOCUMENTS

| 9,473,137 B2 * | 10/2016 | Miao ...................... H03K 19/20 |
| 2005/0162303 A1 | 7/2005 | Cho et al. |
| 2012/0236626 A1 * | 9/2012 | Gaillardon ............. H10B 63/32 257/E21.645 |
| 2013/0105756 A1 * | 5/2013 | Kim ...................... H10N 70/231 257/E47.001 |

(Continued)

FOREIGN PATENT DOCUMENTS

| CN | 102882514 | 1/2013 |
| CN | 105845173 | 8/2016 |

(Continued)

OTHER PUBLICATIONS

Supplementary European Search Report and the European Search Opinion Dated Apr. 17, 2024 From the European Patent Office Re. Application No. 21784170.9. (15 Pages).

(Continued)

*Primary Examiner* — Seokjin Kim (57) ABSTRACT

An electronic memory block comprises phase change memory cells for memory storage and further phase change memory cells forming logic gates, to provide in-memory data processing.

19 Claims, 4 Drawing Sheets

(56) References Cited

U.S. PATENT DOCUMENTS

| | | | |
|---|---|---|---|
| 2014/0063925 A1 | 3/2014 | Friedman et al. | |
| 2014/0169068 A1* | 6/2014 | Lee .................. | G11C 13/0069 365/148 |
| 2015/0236697 A1* | 8/2015 | Miao .................. | G11C 13/004 326/38 |
| 2015/0256178 A1* | 9/2015 | Kvatinsky ............ | H03K 19/177 326/31 |
| 2022/0173309 A1* | 6/2022 | Gong ................ | H10N 70/8828 |

FOREIGN PATENT DOCUMENTS

| | | | |
|---|---|---|---|
| CN | 106128503 | 11/2016 | |
| CN | 106448729 | 2/2017 | |
| EP | 2736044 A1 * | 5/2014 | ............. G11C 11/16 |
| WO | WO 2021/205456 | 10/2021 | |

OTHER PUBLICATIONS

International Search Report and the Written Opinion Dated Jul. 21, 2021 From the International Searching Authority Re. Application No. PCT/IL2021/050403. (11 Pages).

Ahmed et al. "Odd/Even Invert Coding for Phase Change Memory With Thermal Crosstalk", Microprocessors and Microsystems, 49:150-163,, Mar. 201.

Cassinerio et al. "Logic Computation in Phase Change Materials by Threshold and Memory Switching", Advanced Materials, 25(41):5975-5980, Aug. 15, 2013.

* cited by examiner

LOGIC GATES AND STATEFUL LOGIC USING PHASE CHANGE MEMORY

RELATED APPLICATIONS

This application is a National Phase of PCT Patent Application No. PCT/IL2021/050403 having International filing date of Apr. 7, 2021, which claims the benefit of priority under 35 USC § 119(e) of U.S. Provisional Application No. 63/006,114 filed Apr. 7, 2020. The contents of the above applications are all incorporated by reference as if fully set forth herein in their entirety.

ACKNOWLEDGEMENTS

This invention is partially supported by the ERC under the European Union Horizon 2020 Research and Innovation Programme (grant agreement no. 757259).

FIELD AND BACKGROUND OF THE INVENTION

The present invention, in some embodiments thereof, relates to logic gates and stateful logic using phase change memory (PCM).

The memory wall is perhaps the main problem in computing systems today. It means that data movement between memory and CPU is the dominant factor in terms of performance and energy of computing systems. One attractive approach to deal with this problem is to move some of the computation into the memory by adding processing units close to the memory (in the same package or even the same die) or, even better, use the memory cells to compute. The latter is almost impossible with DRAM and SRAM, but is possible with some emerging memory technologies (RRAM for example).

SUMMARY OF THE INVENTION

The present embodiments use phase change memory to build both memory cells and logic gates that can work in the memory blocks together with the memory cells to provide in memory processing and thus reduce the need for data transfer between memory and processor—the memory wall.

According to one aspect of the present invention there is provided a logic gate comprising at least two phase change memory—PCM—cells, the at least two PCM cells having a high resistance phase and a low resistance phase, the at least two PCM cells being connected at a common connection and further having at least one input for an input logic state, wherein a logic output for the gate comprises a phase of an output one of the at least two phase change memory cells following provision of the input logic state.

The logic gate may be configured for a predetermined logic operation by switching the output PCM cell to a specified one of the high resistance and the low resistance phases.

The logic gate may be configured for a predetermined logic operation by presetting the input logic state to a specified one of a set pulse and a reset pulse.

In embodiments, the set pulse and the reset pulse each have a duration and a level, and wherein the duration of the set pulse is longer than the duration of the reset pulse and the level of the set pulse is lower than the level of the reset pulse.

In embodiments, the set pulse is configured to raise a temperature of the cell to a crystallization temperature and the reset pulse is configured to raise the temperature of the cell to a melting temperature.

The logic gate may comprise two PCM cells connected between a word line and respective bit lines, the two PCM cells serving as inputs to the gate, and a third PCM cell being connected between the word line and ground serves as the output for the gate.

In embodiments, the output is preswitched to the low resistance phase, and the input logic state is set to a reset pulse to provide a NOR or a NAND gate.

In embodiments, the output is preswitched to the high resistance phase, and the input logic pulse is set to a set pulse to provide an OR gate.

Embodiments may comprise specifically two PCM cells.

In embodiments, the output is preswitched to the low resistive state and the input logic pulse is set to a reset pulse, the gate thereby providing a NOT gate.

In embodiments, the output is preswitched to the high resistive state and the input logic pulse is set to a set pulse, to provide a copy function.

In embodiments, the output is preswitched to the low resistive state and the input logic pulse is set to a reset pulse.

In embodiments, the output is preswitched to the high resistive state and the input logic pulse is set to a set pulse, thereby to provide an OR gate.

Embodiments may comprise two PCM cells connected at a common node to a resistor.

In embodiments, the input logic pulse is set to a reset pulse, to provide a NIMP function.

In embodiments, the input logic pulse is set to a set pulse to provide IMP or NOR functions.

In an embodiment, three PCM cells are connected between respective inputs and a common node, the common node being connected to a resistance.

In embodiments, the output is initialized to the low resistive state and the input logic pulse is set to a reset pulse, to provide NAND and NOR functionality.

In embodiments, the output is initialized to the high resistive state and the input logic pulse is set to a set pulse, to provide NAND, NOR and XOR functionality.

In embodiments, the output is initialized to the high resistive state and the input logic pulse is set to a set pulse, to provide NIMP functionality.

According to a further aspect of the present embodiments, an electronic data storage device comprising phase change memory cells, some of the phase change memory cells comprising any of the logic gates described above.

According to a yet further aspect of the present invention an electronic memory block comprises phase change memory cells for memory storage and further phase change memory cells forming logic gates.

According to another aspect of the present invention there is provided a method of carrying out a logic function using at least two phase change memory cells connected at a common connection and having predetermined set and reset pulses, the method comprising:

placing one of the memory cells in a predetermined one of first and second phases; and selecting one of the predetermined set and reset pulses as a logic input pulse.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

BRIEF DESCRIPTION OF THE SEVERAL VIEWS OF THE DRAWING(S)

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings.

DESCRIPTION OF SPECIFIC EMBODIMENTS OF THE INVENTION

The present invention, in some embodiments thereof, relates to logic gates and stateful logic using phase change memory, and, more particularly, but not exclusively, to the use of phase change memory to produce processing in memory (PIM).

Phase Change Memory (usually called in short PCM or, in the Intel/Micron jargon 3D Xpoint) is another emerging technology that is used today for fast SSD, persistent memories and other applications. To date, PCM has been used only for data storage without computation.

The present embodiments use several techniques to use PCM cells for computation and enable stateful logic. In these techniques the memory cells are used as inputs and outputs of logic gates and by applying different voltage pulses across several memory cells, the output is written to a value that is the result of a logical operation. The present embodiments include different structures that support many different logic functions (NAND, NOR, OR, NOT, IMP, NIMP). All of those gates are crossbar array compatible and therefore can be implemented within the memory array and by that enable real in-memory processing.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

As discussed in the background, the memory wall is perhaps the main problem in computing systems today. It means that data movement between memory and CPU is the dominant factor in terms of performance and energy of computing systems. One attractive approach to deal with this problem is to move some of the computation into the memory by adding processing units close to the memory (in the same package or even the same die) or, even better, use the memory cells to compute. The latter is almost impossible with DRAM and SRAM, but is possible with some emerging memory technologies (RRAM for example). Phase Change Memory (usually called in short PCM or PCRAM or 3D Xpoint or PCMS) is another emerging technology that is used today for fast SSD, persistent memories and other applications.

Since the physical mechanism and the switching behavior of RRAM and PCM are very different, logic gate approaches that are used in RRAM are incompatible and a new logic technique is required. In RRAM, due to the filamentary switching mechanism, the change in its resistance depends on both the voltage polarity and magnitude. Thus, switching to the low resistance state requires a positive voltage and switching from the low resistance state back to the high resistance state uses a negative voltage. In PCM, on the other hand, thermal energy changes the phase of the material, typically chalcogenide glass, between amorphous and crystalline states, where the amorphous state is high resistance and the crystalline state is low resistance, and in order to switch between amorphous and crystalline states, different voltage pulses are used. Specifically, heat produced by the passage of an electric current through a heating element generally made for example of titanium nitride may b used to either quickly heat and quench the glass, making it amorphous, or to hold it in its crystallization temperature range for some time, thereby switching it to the crystalline state. A notable feature is that, in contrast to RRAM, the pulses for setting and resetting have the same polarity. To switch to the low resistance, crystalline, phase, a long and low voltage pulse is used, while a high and short pulse is used to switch to the high resistive, amorphous, state, as explained in greater detail in respect of FIG. 13 hereinbelow.

Figures 1A, 1B, 2, 3, 4:
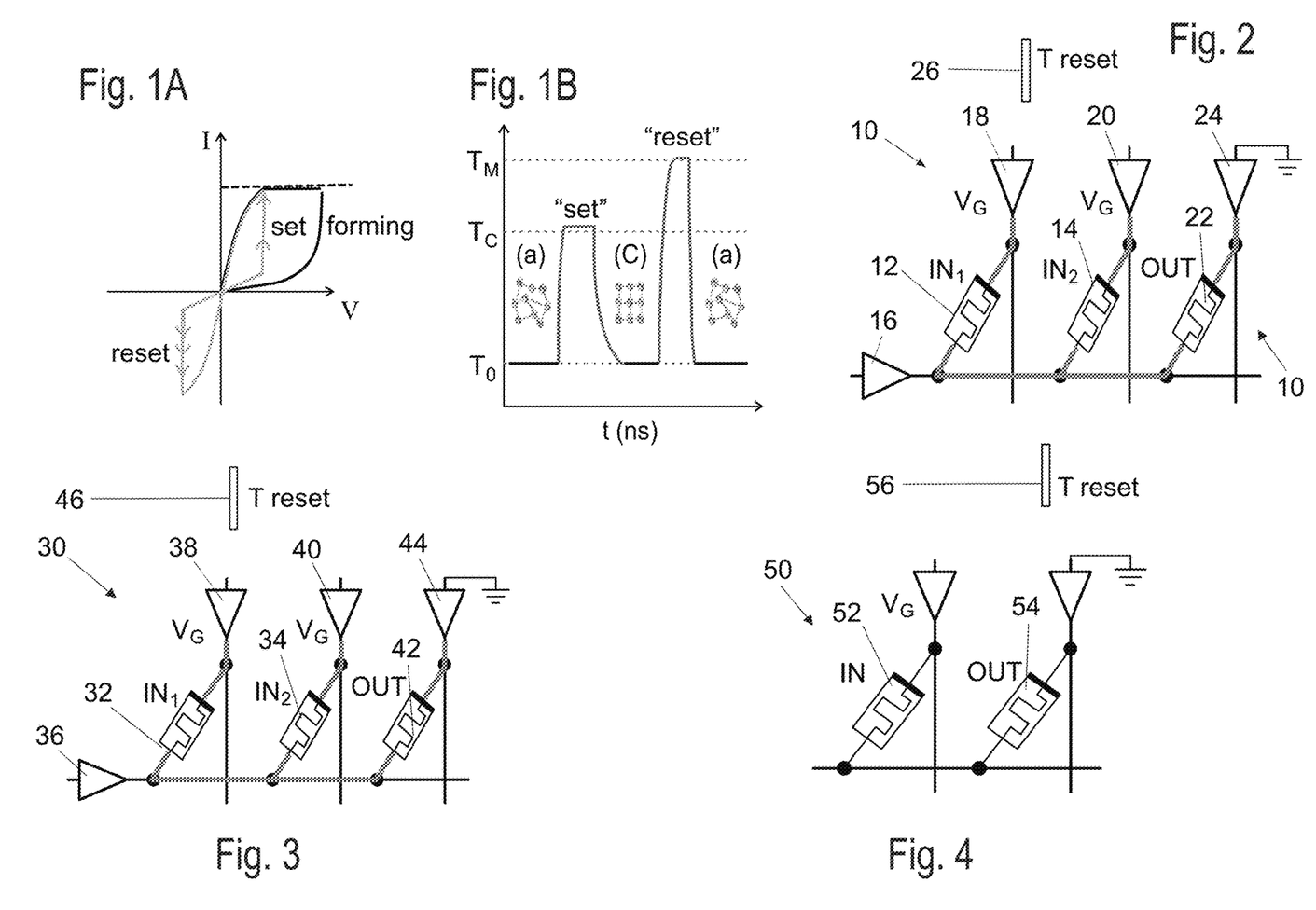
FIGS. 1A and 1B are two simplified diagrams showing switching mechanisms for bipolar RRAM and PCM devices.
FIGS. 2, 3, 4, 5, 6, 7, 8, 9, 10, 11 and 12 show logic gates built of PCM cells according to embodiments of the present invention.

To date, PCM has been used only for data storage without computation. The different switching mechanisms for PCM and RRAM as explained above, are illustrated in FIGS. 1A and 1B. FIG. 1A illustrates switching of a bipolar RRAM device around a hysteresis structure, and FIG. 1B illustrates switching mechanisms of a PCM device. For the PCM, a pulse with the width $T_{reset}$ ($T_{set}$) and magnitude $V_{reset}$ ($V_{set}$) is applied for reset (set), $T_{reset} < T_{set}$, $V_{reset} > V_{set}$. That is to say, a reset is achieved.

State-of-the-art solutions either rely on non-PCM technologies (i.e., cannot be used for memories) or separate completely the computation from the memory and by that suffer from the memory wall phenomenon.

Processing-In-Memory (PIM), suggests putting computation capabilities inside the memory. This enables intrinsic computation parallelism, avoiding the need for costly chip-to-chip transfers (in terms of performance and energy), thus yielding massively parallel, high-performance, energy-efficient processing.

The present embodiments deal with computation using PCM to enable PIM. The present embodiments entail several techniques to use PCM cells for computation and enable stateful logic. In these logic techniques, the memory cells are used as inputs and outputs of logic gates and by applying different voltage pulses across several memory cells, the output is written to a value that is the result of a logical operation. The present embodiments may provide different structures that support many different logic functions (including NAND, NOR, OR, NOT, IMP, NIMP). These gates can be crossbar array compatible and therefore can be implemented within the memory array (as part of the main memory, storage, storage class memory or any other memory type) and by that enable real in-memory processing. Alternatively, they can be used as standalone logic gates.

The described gates are the building blocks to enable processing-in-memory for PCM devices (a unit such as the memristive memory processing unit, or any memory that has computing capabilities). It is possible to take existing products such as Intel Optane and transfer them with minor changes into such a memristive memory processing unit using the present embodiments.

Certain features that the present embodiments may provide include:
1. Allowing parallel processing of data in PCM memories, including in existing products.
2. Requiring only minor changes to an existing PCM memory to be operational.
3. PCM is an attractive and mature technology, the only resistive memory that is already in mass production and is projected to be in large volumes.
4. PCM logic, as with PCM for memory applications, relies only on the pulse width and magnitude with no dependence on polarity.
5. Massive parallelism and no data transfer may be a path to performance improvement for many applications.

The Logic Techniques:

The inputs of the gates may include the initial resistance, that is the stored logical value in the cell, of the PCM cells making up the gate. The output, or result, of the gate is the resistance of the output PCM cell at the end of operation. The initial resistance of the output PCM cell may either be defined prior to the computation, in an initialization step, or alternatively, the existing output may be used as one of the inputs.

The inputs and outputs may be connected via a shared node, which may be a wire, bitline, wordline, selectline or any other connection, and a pulse or a voltage or pulses or voltages are applied to the gate. The pulse(s) may create a SET operation, that is switching the output cell from a high resistive state to a low resistive state, or a RESET operation, which is switching the output cell from a low resistive state to a high resistive state. The specific width and magnitude of the pulse determines whether a SET or a RESET operation, or for that matter, no operation at all, is carried out, as illustrated in FIG. 1(b).

Depending on the specific connection, the specific pulse and the logical states of the inputs, the output will either change its value (switch) or not, and this is the logical operation.

The present embodiments provide several different circuits and apply to each of the circuits different pulses, to produce a range of logic gates. Specifically, several of the circuits provide multiple logic gates depending on the pulses applied, and the different logic gate truth tables may be provided in different ways with several of the circuits. Hence more than one option is provided for many of the commonly used logic circuits.

Considering now FIGS. 2 to 12, the details of logic gates according to embodiments of the present invention are described below with their associated schematics, truth tables, and pulses.

A first circuit 10 according to the present embodiments is shown schematically in FIG. 2 and may be used to provide NOR and NAND gates.

Two PCM devices 12 and 14 are connected between op amp 16 of a word line and op amps 18 and 20 of respective bit lines, and serve as inputs to the gate. A third PCM device 22 is connected between word line op amp 16 and an op amp 24 leading to ground. The third PCM device serves as the output for the gate.

As shown, pulse 26 with the width of $T_{reset}$ is applied via op amps 18 and 20 at voltages $V_G$, $V_G/2$ and $V_G/3$. The output is initialized to logical 1, which is the low resistive state, in each case.

The op amps generally serve to set the voltage level of the line and are mentioned for completeness. They are not discussed further in the below.

Different magnitudes determine the specific operation between NOR and NAND as detailed in the table below. Specifically, when VG>2VR the circuit acts as a NOR gate. All inputs flip the output except for 0,0. When 3Vr/2<VG<2Vr then the circuit acts as a NAND gate and no inputs flip the output except for (1,1). The NOR gate operation loses the inputs. NAND gate operation retains the input states IN1 and IN2, although obviously not OUT_0.

| IN1 | IN2 | OUT_0 | V_IN | V_OUT | NOR IF(VG > 2 VR) | NAND IF(3 Vr/2 < VG < 2 Vr) | VG > Vreset T = Treset |
|---|---|---|---|---|---|---|---|
| 0 | 0 | 1 | VG | 0 | 1 | 1 | |
| 0 | 1 | 1 | VG/2 | VG/2 | 0 | 1 | |
| 1 | 0 | 1 | VG/2 | VG/2 | 0 | 1 | |
| 1 | 1 | 1 | VG/3 | 2 VG/3 | 0 | 0 | |
| Comments | | | | | Destructive inputs (VG/2 will change the inputs | Non-destructive | |

A second circuit 30 according to the present embodiments is shown schematically in FIG. 3 and may be used to provide an OR gate.

Two PCM devices 32 and 34 are connected between op amp 36 of a word line and op amps 38 and 40 of respective bit lines, and serve as inputs to the gate. A third PCM device 42 is connected between word line op amp 36 and an op amp 44 leading to ground. The third PCM device serves as the output for the gate.

As shown, pulse 46 with the width of $T_{reset}$ is applied via op amps 38 and 40 at voltage $V_G/3$. The output is initialized to logical 0, which is the high resistive state, in each case.

The specific operation is OR as detailed in the table below. The condition $V_{set}<V_G<1.5V_{set}<V_{reset}$ is applied.

| | | | | | OR | $V_{set} < V_G < 1.5\ V_{set} < V_{reset}$ |
|---|---|---|---|---|---|---|
| IN1 | IN2 | OUT_0 | V_IN | V_OUT | OUT | T = Tset |
| 0 | 0 | 0 | VG/3 | 2 VG/3 | 0 | |
| 0 | 1 | 0 | 0 | VG | 1 | |
| 1 | 0 | 0 | 0 | VG | 1 | |
| 1 | 1 | 0 | 0 | VG | 1 | |

In FIG. 4, PCM-based circuitry 50 for a NOT gate is provided. One PCM device 52 is the input and a second PCM device 54 is the output.

A pulse 56 with the width of $T_{reset}$ is applied at voltage $V_G$. The output is initialized to logical 1 (low resistive state).

The specific operation is NOT as detailed in the table below. With the condition that $V_G>2V_{reset}$, the input is inverted at the output.

| IN | OUT_0 | V_IN | V_OUT | NOT | VG > 2 Vreset T = Treset |
|---|---|---|---|---|---|
| 0 | 1 | VG | 0 | 1 | |
| 1 | 1 | VG/2 | VG/2 | 0 | |
| Comments | | Destructive inputs (VG/2 will change the input to 0 as well) | | | |

Figure 5:
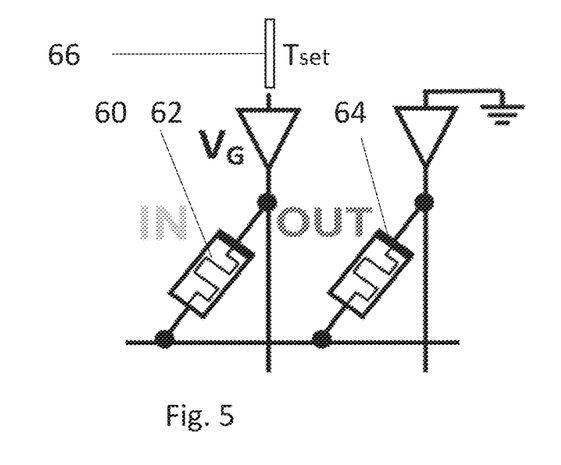

Reference is now made to FIG. 5 which is a conceptual diagram of a further circuit 60 according to the present embodiments.

PCM device 62 is the input and second PCM device 64 is the output.

A pulse 66 with the width of $T_{set}$ is applied at voltage $V_G$ or $V_G/2$. The output is initialized to logical 0, which is the high resistive state.

The specific operation is Copy (or move) as detailed in the table below. The condition $V_{set}<V_G<2V_{set}<V_{reset}$ is observed and the input is copied to the output.

| | | | | COPY | $V_{set} < V_G < 2V_{set} < V\ reset$ |
|---|---|---|---|---|---|
| IN | OUT_0 | V_IN | V_OUT | OUT | T = Tset |
| 0 | 0 | VG/2 | VG/2 | 0 | |
| 1 | 0 | 0 | VG | 1 | |

Figure 6:
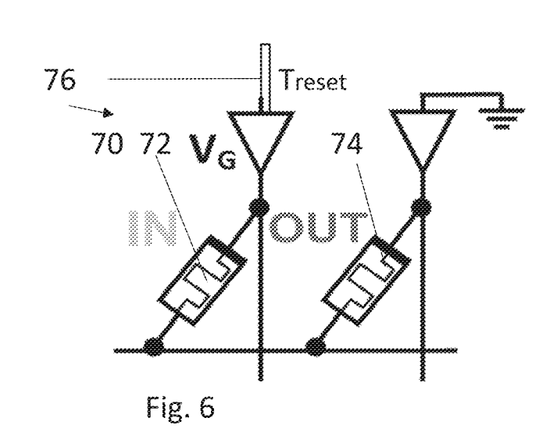

Reference is now made to FIG. 6, which is a conceptual diagram of a further circuit 70 according to the present embodiments.

Two PCM devices 70 and 72 are the inputs and one of them 72 also serves as the output.

A pulse with the width of $T_{reset}$ is applied to $V_G$. The output is initialized to logical 1 (low resistive state).

The specific operation is detailed in the table below. The condition VG>2Vreset is observed.

| IN1 | IN2 (OUT) | V_IN | V_OUT | IN1' | IN2' | VG > 2 Vreset IF(VG > 2 Vr) T = Treset |
|---|---|---|---|---|---|---|
| 0 | 0 | VG/2 | VG/2 | 0 | 0 | |
| 0 | 1 | VG | 0 | 0 | 1 | |

-continued

| IN1 | IN2 (OUT) | V_IN | V_OUT | IN1' | IN2' | VG > 2 Vreset IF(VG > 2 Vr) T = Treset |
|---|---|---|---|---|---|---|
| 1 | 0 | 0 | VG | 1 | 0 | |
| 1 | 1 | VG/2 | VG/2 | 0 | 0 | |

Figure 7:
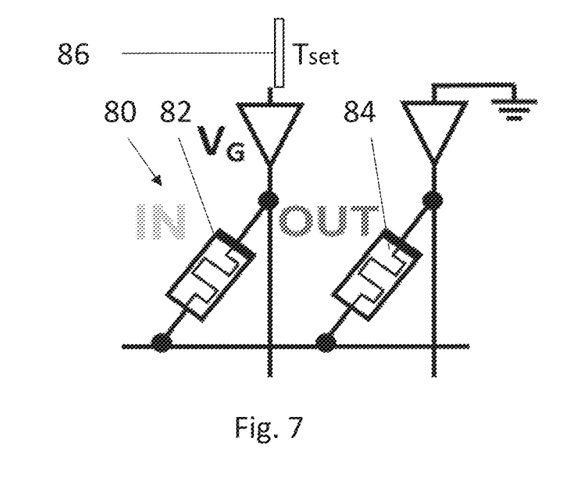

Reference is now made to FIG. 7, which is a conceptual diagram of a further circuit 80 according to the present embodiments.

Two PCM devices 80 and 82 are the inputs and one of them 82 also serves as the output.

A pulse with the width of $T_{set}$ is applied at a voltage of $V_G$ or $V_G/2$. The output is initialized to logical 0 which is the high resistive state.

The specific operation is OR as detailed in the table below.

| | | | | IF(VG/2 > Vset)==> 2 Vset < VG < Vreset | | IF(VG > Vset, VG/2 < Vset)==> Vset < VG < 2 Vset, Vreset | |
|---|---|---|---|---|---|---|---|
| IN1 | IN2 (OUT) | V IN | V_OUT | IN1' | IN2' | IN1' | IN2' |
| 0 | 0 | VG/2 | VG/2 | 1 | 1 | 0 | 0 |
| 0 | 1 | VG | 0 | 1 | 1 | 1 | 1 |
| 1 | 0 | 0 | VG | 1 | 1 | 1 | 1 |
| 1 | 1 | VG/2 | VG/2 | 1 | 1 | 1 | 1 |
| | | | | Meaningless | | OR | OR |

Figure 8:
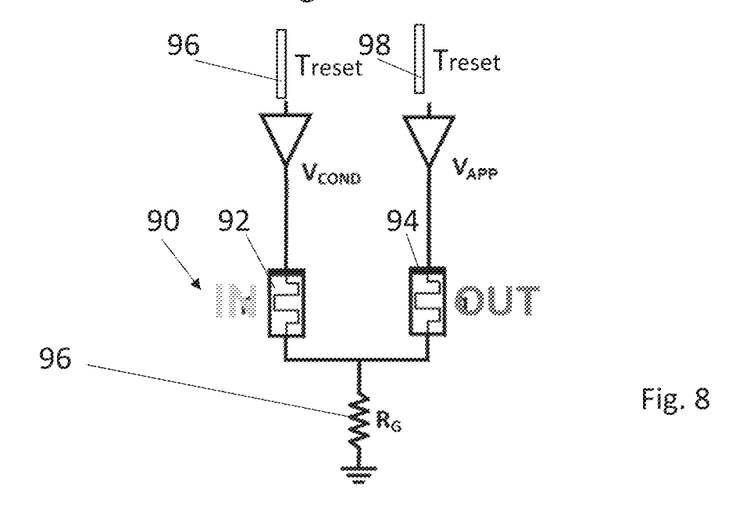

Reference is now made to FIG. 8 which illustrates a circuit 90 which may operate as a NIMP circuit. Two PCM devices 92 and 94 are the inputs and one of them 94 also serves as the output. An additional resistor 96 is connected between a common node of the two PCM devices 92 and 94 and ground. The additional resistor may itself be a PCM device, but any other resistive device with a resistance of $R_G$, a resistance between the low and high resistive states of the PCM, may be used.

Two voltages are applied to the gate, $V_{COND}$ 96 and $V_{APP}$ 98 where $V_{APP} > V_{COND}$ and the voltages are pulsed at a width of $T_{reset}$.

Different magnitudes determine the specific operation as detailed in the table below, where the output is the value at the end of computation in each input $IN_i'$. The result is destructive of the inputs.

| IN1 | IN2 (OUT) | INT' | IN2' |
|---|---|---|---|
| 0 | 0 | 0 | 0 |
| 0 | 1 | 0 | 1 |
| 1 | 0 | 1 | 0 |
| 1 | 1 | 1 | 0 |
| Comments | | | Destructive |

Figure 9:
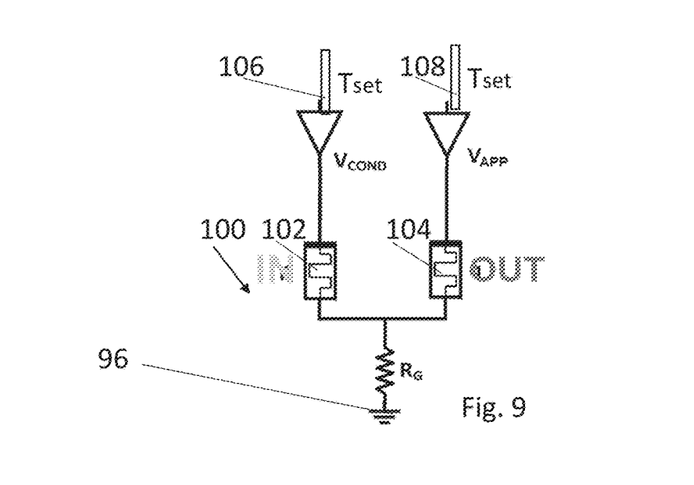

Reference is now made to FIG. 9 which illustrates a circuit 100 which may operate as an IMP or an OR circuit. Two PCM devices 102 and 104 are the inputs and one of them 104 also serves as the output. An additional resistor 106 is connected between a common node of the two PCM devices 102 and 104 and ground. The additional resistor may itself be a PCM device, but any other resistive device with a resistance of $R_G$, a resistance between the low and high resistive states of the PCM, may be used.

Two voltages are applied to the gate, $V_{COND}$ 106 and $V_{APP}$ 108 where $V_{APP} > V_{COND}$ and the voltages are pulsed at a width of $T_{set}$. Different magnitudes and ratios between the voltages determine the specific operation as detailed in the table below and the output is the value at the end of computation in each input $IN_i'$.

| | | Option 1 | | Option 2 | | |
|---|---|---|---|---|---|---|
| IN1 | IN2 (OUT) | IN1' | IN2' | IN1' | IN2' | T = Tset |
| 0 | 1 | 0 | 1 | 0 | 0 | |
| 0 | 1 | 1 | 1 | 0 | 1 | |
| 1 | 0 | 1 | 0 | 1 | 1 | |
| 1 | 1 | 1 | 1 | 1 | 1 | |
| | | Destructive | IMP | Non-destructive | OR | Non-destructive OR, parameter sensitive |

Figure 10:
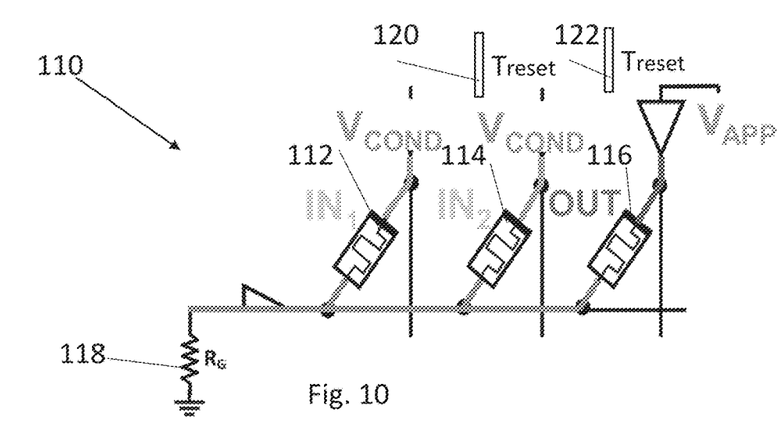

Reference is now made to FIG. 10 which illustrates a circuit 110 which may operate as NAND or a NOR circuit. Two PCM devices 112 and 114 are the inputs and a third PCM device 116 serves as the output. An additional resistor 118 is connected between a common node of the three PCM devices 112, 114 and 116, and ground. The additional resistor 118 may itself be a PCM device, but any other resistive device with a resistance of $R_G$, a resistance between the low and high resistive states of the PCM, may be used.

The output is initialized to the low resistive state, a logical 1.

Two voltages, are applied to the gate, $V_{COND}$ 120 and $V_{APP}$ 122 under the condition that $V_{APP} > V_{COND}$, using pulses with the width of $T_{reset}$.

Different magnitudes and ratios between the voltages determine the specific operation as detailed in the table below to give either a NAND or a NOR output.

| IN1 | IN2 (OUT) | Option 1 OUT | Option 2 OUT |
|---|---|---|---|
| 0 | 0 | 1 | 1 |
| 0 | 1 | 1 | 0 |
| 1 | 0 | 1 | 0 |
| 1 | 1 | 0 | 0 |
| Comments | | NAND | NOR |

Figure 11:
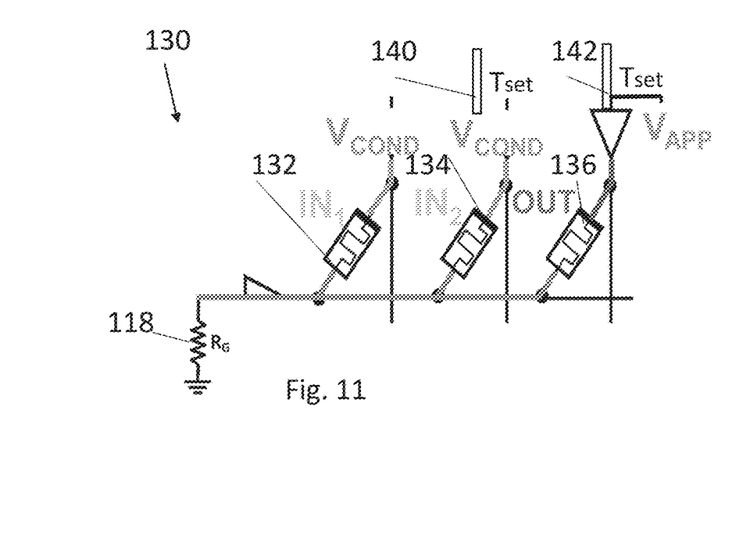

Reference is now made to FIG. 11 which illustrates a circuit 130 which may operate as NAND or an XOR or a NOR circuit. Two PCM devices 132 and 134 are the inputs and a third PCM device 136 serves as the output. An additional resistor 138 is connected between a common node of the three PCM devices 132, 134 and 136, and ground. The additional resistor 138 may itself be a PCM device, but any other resistive device with a resistance of $R_G$, a resistance between the low and high resistive states of the PCM, may be used.

The output is initialized to a high resistive state (logical 0).

Two voltages are applied to the gate, $V_{COND}$ 140 and $V_{APP}$ 142 under the condition that $V_{APP} > V_{COND}$ and the pulses are of width $T_{set}$.

Different magnitudes and ratios between the voltages determine the specific operation as detailed in the table below.

| IN1 | IN2 (OUT) | Option 1 OUT | Option 2 OUT | Option 3 OUT |
|---|---|---|---|---|
| 0 | 0 | 1 | 0 | 1 |
| 0 | 1 | 0 | 1 | 1 |
| 1 | 0 | 0 | 1 | 1 |
| 1 | 1 | 0 | 0 | 0 |
|   |   | NOR | XOR | NAND |

Figure 12:
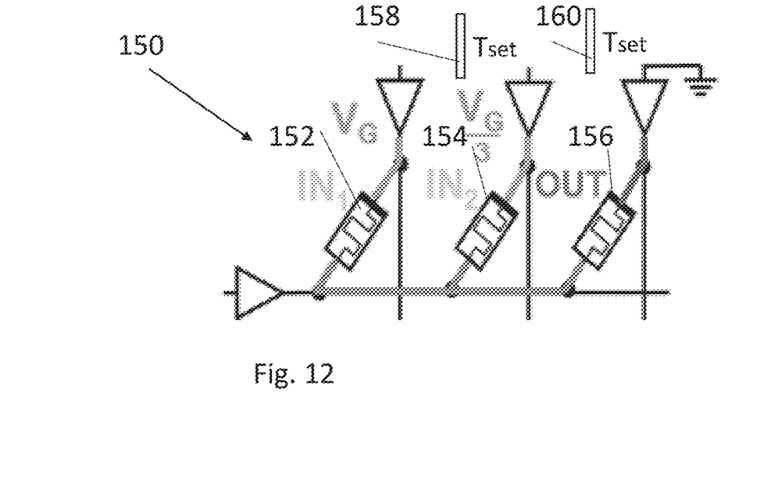

Reference is now made to FIG. 12 which illustrates a circuit 150 which may operate as a NIMP circuit. Two PCM devices 152 and 154 are the inputs and a third PCM device 156 serves as the output. The output is initialized to a high resistive state (logical 0).

Two voltages are applied to the gate, $V_G$ and a portion of $V_G$ (here $V_G/3$ as an example) in pulses 158 and 160 with the width of $T_{set}$.

Different magnitudes and ratios between the voltages determine the specific operation as detailed in the table below.

| IN1 | IN2 | OUT_0 | VJN1 | V_IN2 | V_OUT | NIMP OUT |
|---|---|---|---|---|---|---|
| 0 | 0 | 0 | 5 VG/9 | VG/9 | 4 VG/9 | 0 |
| 0 | 1 | 0 | 2 VG/3 | 0 | VG/3 | 0 |
| 1 | 0 | 0 | 0 | 2 VG/3 | VG | 1 |
| 1 | 1 | 0 | VG/3 | VG/3 | 2 VG/3 | 0 |
|   |   |   |   |   |   | Non-destructive |

Figure 13:
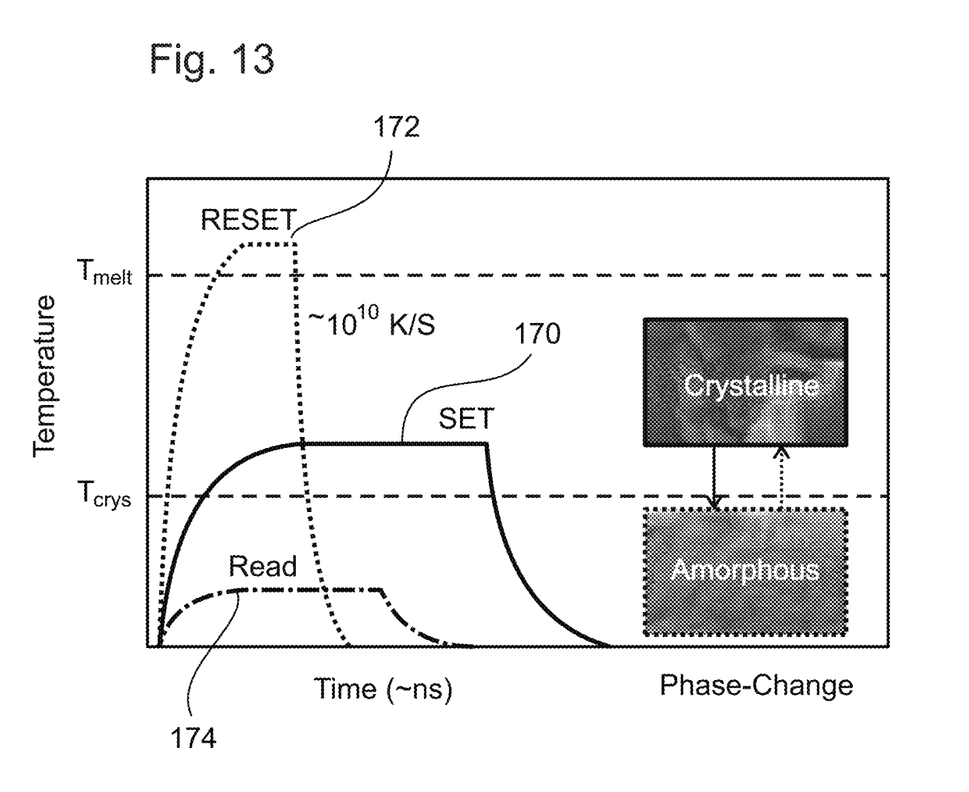
FIG. 13 shows in greater detail the switching mechanism of a PCM device as used in the present embodiments.

Reference is now made to FIG. 13, which shows in greater detail how the set and reset operations work for PCM devices, as well as showing the read operation. The material has a temperature Tcrys below which it is amorphous and at which it crystalizes, and there is a Tmelt temperature at which the crystal structure is lost. If the pulse is immediately removed then instead of actually becoming liquid the material returns to the amorphous state. A longer lasting but less energetic pulse 170 thus causes the amorphous form to turn into the crystal form at Tcrys. A shorter and highly energetic pulse 172 causes melting and allows the material to return to the amorphous phase. A read operation to read the state of the cell uses a low energy read pulse 174 that does not heat the material sufficiently to cause a state change.

It is expected that during the life of a patent maturing from this application many relevant logic gates and memory circuits will be developed and the scopes of the corresponding and other terms are all intended to include all such new technologies a priori.

The terms "comprises", "comprising", "includes", "including", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise.

It is appreciated that certain features of the invention, which, for clarity, described in the context of separate embodiments, may also be provided in combination in a single embodiment and the present description is to be construed as if such embodiments are explicitly set forth herein. Conversely, various features of the invention, which are, for brevity, described in the context of a single embodiment, may also be provided separately or in any suitable subcombination or may be suitable as a modification for any other described embodiment of the invention and the present description is to be construed as if such separate embodiments, subcombinations and modified embodiments are explicitly set forth herein. Certain features described in the context of various embodiments are not to be considered essential features of those embodiments, unless the embodiment is inoperative without those elements.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting. In addition, any priority document(s) of this application is/are hereby incorporated herein by reference in its/their entirety.

What is claimed is:

1. A logic gate comprising at least two phase change memory—PCM—cells, said at least two PCM cells having a high resistance phase and a low resistance phase, said at least two PCM cells being connected at a common connection and further the logic gate having at least one gate input for an input logic state, wherein a logic output for the logic gate comprises a phase of an output one of said at least two phase change memory cells, the phase of the output one of said at least two phase change memory cells forming the logic output following provision of said input logic state at said gate input, the logic gate being configured to react to a set pulse and a reset pulse as logic input pulses, wherein the set pulse is configured to raise a temperature of the cell to a crystallization temperature and the reset pulse is configured to raise the temperature of the cell to a melting temperature, wherein the at least two PCM cells comprise three PCM cells, said three PCM cells being connected between respective inputs and said common connection, said common connection being connected to a resistance.

2. The logic gate of claim 1, configured for a predetermined logic operation by switching said output one of said at least two PCM cells to a predetermined one of said high resistance and said low resistance phases.

3. The logic gate of claim 1, configured for a predetermined logic operation by presetting said input logic state to a specified member of the group consisting of a set pulse and a reset pulse.

4. The logic gate of claim 3, wherein said set pulse and said reset pulse each have a duration and a level, and wherein the duration of the set pulse is longer than the duration of the reset pulse and the level of the set pulse is lower than the level of the reset pulse.

5. The logic gate of claim 1, comprising two of said at least two PCM cells connected between a word line and respective bit lines, which said at least two PCM cells serve as inputs to the gate, a third PCM cell being connected between said word line and ground serving as the output for the gate.

6. The logic gate of claim 5, wherein the output is preswitched to the low resistance phase, and wherein said input logic state is set to a reset pulse to provide a NOR or a NAND gate.

7. The logic gate of claim 5, wherein the output is preswitched to the high resistance phase, and the input logic pulse is set to a set pulse to provide an OR gate.

8. The logic gate of claim 1, wherein the output is preswitched to the low resistive state and the input logic pulse is set to a reset pulse, the gate thereby providing a NOT gate.

9. The logic gate of claim 1, wherein the output is preswitched to the high resistive state and the input logic pulse is set to a set pulse, to provide a copy function.

10. The logic gate of claim 1, wherein the output is preswitched to the low resistive state and the input logic pulse is set to a reset pulse.

11. The logic gate of claim 1, wherein the output is preswitched to the high resistive state and the input logic pulse is set to a set pulse, thereby to provide an OR gate.

12. The logic gate of claim 1, comprising two of said at least two PCM cells connected at said common connection to a resistor.

13. The logic gate of claim 12, wherein the input logic pulse is set to a reset pulse, to provide a NIMP function.

14. The logic gate of claim 12, wherein the input logic pulse is set to a set pulse to provide IMP or NOR functions.

15. The logic gate of claim 1, wherein the output is initialized to the low resistive state and the input logic pulse is set to a reset pulse, to provide NAND and NOR functionality.

16. The logic gate of claim 1, wherein the output is initialized to the high resistive state and the input logic pulse is set to a set pulse, to provide NAND, NOR and XOR functionality.

17. The logic gate of claim 1, wherein the output is initialized to the high resistive state and the input logic pulse is set to a set pulse, to provide NIMP functionality.

18. An electronic data storage device comprising phase change memory cells, some of said phase change memory cells comprising logic gates according to claim 1.

19. A method of carrying out a logic function using at least two phase change memory (PCM) cells connected at a common connection and having predetermined set and reset pulses, the method comprising:

placing one of the PCM cells in a predetermined one of first and second phases; and selecting one of said predetermined set and reset pulses as a logic input pulse, wherein the set pulse is configured to raise a temperature of the cell to a crystallization temperature and the reset pulse is configured to raise the temperature of the cell to a melting temperature, wherein the at least two PCM cells comprise three PCM cells, and two of said three PCM cells are connected between respective inputs and said common connection, said common connection being connected to a resistance.

\* \* \* \* \*